United States Patent
Xiong (10) Patent No.: US 10,302,976 B2
(45) Date of Patent: May 28, 2019

(54) METHOD AND DEVICE FOR RELEASING FILM LAYER STRESS OF ARRAY SUBSTRATE

(71) Applicant: Shenzhen China Star Optoelectronics Semiconductor Display Technology Co., Ltd., Shenzhen (CN)

(72) Inventor: Yuan Xiong, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

(*) Notice: Subject to any disclaimer, the term of this patent is extended or adjusted under 35 U.S.C. 154(b) by 0 days.

(21) Appl. No.: 15/577,767

(22) PCT Filed: Jun. 14, 2017

(86) PCT No.: PCT/CN2017/088190
§ 371 (c)(1),
(2) Date: Nov. 29, 2017

(87) PCT Pub. No.: WO2018/205339
PCT Pub. Date: Nov. 15, 2018

(65) Prior Publication Data
US 2018/0329237 A1    Nov. 15, 2018

(30) Foreign Application Priority Data

May 9, 2017    (CN) .......................... 2017 1 0322547

(51) Int. Cl.
*G02F 1/13*    (2006.01)
*H01L 21/67*    (2006.01)
(Continued)

(52) U.S. Cl.
CPC .......... *G02F 1/1303* (2013.01); *G02F 1/1362* (2013.01); *G02F 1/1368* (2013.01);
(Continued)

(58) Field of Classification Search
CPC . G02F 1/1303; G02F 1/1368; H01L 21/67092
See application file for complete search history.

(56) References Cited

U.S. PATENT DOCUMENTS 9,134,559 B2 *    9/2015    Zhou ........................ C03C 17/09
9,442,285 B2 *    9/2016    Rogers ...................... G02B 3/14

OTHER PUBLICATIONS

Boncheva et al., "Templated Self-Assembly: Formation of Folded Structures by Relaxation of Pre-stressed, Planar Tapes", Advance Materials 17, No. 5, Mar. 5, 2005, pp. 553-557.*

* cited by examiner

*Primary Examiner* — William Coleman
(74) *Attorney, Agent, or Firm* — Leong C. Lei (57) ABSTRACT

The present invention provides a method and a device for releasing film layer stress of an array substrate. In the method for releasing film layer stress of an array substrate, the array substrate is positioned, in a still condition, on a carrying table involving an arc surface and a carrying table curvature adjusting mechanism is operated to gradually vary the curvature of the arc surface of the carrying table such that the array substrate, under the action of the gravity, is caused to curve according to the arc surface of the carrying table and the degree of curving varies following the variation of the curvature of the arc surface of the carrying table so as to make each film layer of the array substrate exhibiting uniform tension stress or compression stress, and eventually, the stress accumulated among the film layers of the array substrate during a manufacturing process can be released through the action of the external force, thereby reducing the influence that an external pressure causes on
(Continued)

the property of a device provided on the array substrate during a subsequent process and uses thereof, so as to reduce poor displaying of a display panel and ensure product yield.

13 Claims, 8 Drawing Sheets

(51) Int. Cl.
*G02F 1/1368* (2006.01)
*H01L 21/683* (2006.01)
*H01L 21/687* (2006.01)
*G02F 1/1362* (2006.01)
*H01L 21/77* (2017.01)

(52) U.S. Cl.
CPC .. *H01L 21/67092* (2013.01); *H01L 21/67288* (2013.01); *H01L 21/6835* (2013.01); *H01L 21/68735* (2013.01); *G02F 2201/50* (2013.01); *H01L 2021/775* (2013.01)

Step 1: providing a flexible carrying table (1) and a carrying table curvature adjusting mechanism (3) coupled to the carrying table (1);

Step 2: providing an array substrate (2), wherein the array substrate (2) has a lengthwise edge having a length that is smaller than a length and a width of the carrying table (1);

Step 3: operating the carrying table curvature adjusting mechanism (3) to cause the carrying table (1) to curve so as to have an upper surface of the carrying table (1) deformed into a first arc surface, and positioning the array substrate (2) on the upper surface of the carrying table (1) such that a first center line of the array substrate (2) is coincident with a center line of the first arc surface, wherein the first arc surface is a concave curved surface that is recessed with respect to a horizontal plane and has a radius of curvature that is a predetermined first radius of curvature;

Step 4: keeping the array substrate (2) still on the carrying table (1) for a predetermined period of time and operating the carrying table curvature adjusting mechanism (3) to gradually change the curvature of the curving of the carrying table (1) within the predetermined period of time such that the upper surface of the carrying table (1) varies from the first arc surface to a second arc surface, wherein the second arc surface is a convex curved surface that is raised with respect to the horizontal plane and has a radius of curvature that is a predetermined second radius of curvature;

Step 5: removing the array substrate (2), operating the carrying table adjusting mechanism (3) to restore the upper surface of the carrying table (1) back to the first arc surface, rotating the array substrate (2) about the center point thereof by 90 degrees and re-positioning on the upper surface of the carrying table (1) such that a second center line of the array substrate (2) is coincident with the center line of the first arc surface, the second center line being perpendicular to the first center line;

Step 6: keeping the array substrate (2) still on the carrying table (1) for a predetermined period of time and operating the carrying table curvature adjusting mechanism (3) to gradually change the curvature of the carrying table (1) within the predetermined period of time such that the upper surface of the carrying table (1) varies from the first arc surface to the second arc surface to complete releasing of film layer stress of the array substrate (2).

METHOD AND DEVICE FOR RELEASING FILM LAYER STRESS OF ARRAY SUBSTRATE

BACKGROUND OF THE INVENTION

1. Field of the Invention

The present invention relates to the field of display technology, and more particular to a method and a device for releasing film layer stress of an array substrate.

2. The Related Arts

With the development of the display technology, all sorts of flat panel display devices, such as liquid crystal displays (LCDs), which show various advantages, such as high image quality, low power consumption, thin device body, and wide range of applications, have been widely used in various consumer electronic products, such as mobile phones, televisions, personal digital assistants (PDAs), digital cameras, notebook computers, and desktop computers and are becoming a main stream of display devices.

Most of the LCDs that are currently available in the market are backlighting LCDs, which comprise a liquid crystal display panel and a backlight module. The working principle of the liquid crystal display panel is that with liquid crystal molecules disposed between two parallel glass substrates and multiple vertical and horizontal tiny conductive wires arranged between the two glass substrates, electricity is applied to control the liquid crystal molecules to change direction for refracting out light emitting from the backlight module to generate an image.

The liquid crystal display panel is generally made up of a color filter (CF) substrate, a thin-film transistor (TFT) array substrate, liquid crystal (LC) interposed between the CF substrate and the array substrate, and sealant and is generally manufactured with a process involving an anterior stage of array engineering (for thin film, photolithography, etching, and film peeling), an intermediate stage of cell engineering (for lamination of the array substrate and the CF substrate), and a posterior stage of module assembly (for combining a drive integrated circuit (IC) and a printed circuit board). Among these stages, the anterior stage of array engineering generally involves the formation of the array substrate for controlling the movement of liquid crystal molecules; the intermediate stage of cell engineering generally involves filling liquid crystal between the array substrate and the CF substrate; and the posterior stage of module assembly generally involves combination of the drive IC and the printed circuit board for driving the liquid crystal molecules to rotate for displaying images.

During a manufacturing process, the array substrate must be subjected multiple times to chemical vapor deposition (CVD) and physical vapor deposition (PVD) that are high temperature operations, with various parameters to form deposition of various inorganic, organic, and metal film layers, so that stress differences are generally induced among internal film layers of the array substrate so manufactured. After the cell engineering stage, the stresses among the internal film layers may vary upon being acted upon by an external force so that devices provided on the array substrate may suffer various degrees of property drifting (such as local pressures being not uniform), resulting in irregular and abnormal situation of displaying on a display panel.

SUMMARY OF THE INVENTION

An objective of the present invention is to provide a method for releasing film layer stress of an array substrate, which releases stresses accumulated among the film layers of an array substrate during a manufacturing process so as to reduce poor displaying of a display panel and to ensure product yield.

Another objective of the present invention is to provide a device for releasing film layer stress of an array substrate, which releases stresses accumulated among the film layers of an array substrate during a manufacturing process so as to reduce poor displaying of a display panel and to ensure product yield.

To achieve the above objectives, the present invention provides a method for releasing film layer stress of an array substrate, which comprises the following steps:

Step 1: providing a flexible carrying table and a carrying table curvature adjusting mechanism coupled to the carrying table;

Step 2: providing an array substrate, wherein the array substrate has a lengthwise edge having a length that is smaller than a length and a width of the carrying table;

Step 3: operating the carrying table curvature adjusting mechanism to cause the carrying table to curve so as to have an upper surface of the carrying table deformed into a first arc surface, and positioning the array substrate on the upper surface of the carrying table such that a first center line of the array substrate is coincident with a center line of the first arc surface, wherein the first arc surface is a concave curved surface that is recessed with respect to a horizontal plane and has a radius of curvature that is a predetermined first radius of curvature;

Step 4: keeping the array substrate still on the carrying table for a predetermined period of time and operating the carrying table curvature adjusting mechanism to gradually change the curvature of the curving of the carrying table within the predetermined period of time such that the upper surface of the carrying table varies from the first arc surface to a second arc surface, wherein the second arc surface is a convex curved surface that is raised with respect to the horizontal plane and has a radius of curvature that is a predetermined second radius of curvature;

Step 5: removing the array substrate, operating the carrying table curvature adjusting mechanism to restore the upper surface of the carrying table back to the first arc surface, rotating the array substrate about the center point thereof by 90 degrees and re-positioning on the upper surface of the carrying table such that a second center line of the array substrate is coincident with the center line of the first arc surface, the second center line being perpendicular to the first center line; and Step 6: keeping the array substrate still on the carrying table for a predetermined period of time and operating the carrying table curvature adjusting mechanism to gradually change the curvature of the carrying table within the predetermined period of time such that the upper surface of the carrying table varies from the first arc surface to the second arc surface to complete releasing of film layer stress of the array substrate.

The first radius of curvature ranges from 4 m to 10 m.

The second radius of curvature ranges from 4 m to 10 m.

The predetermined period of time is between 10 minutes and 30 minutes.

The film layer stress of the array substrate is released after the array substrate has completed array engineering but before cell engineering.

The carrying table is made of a material comprising a rubber or resinous material.

In Step 4 and Step 6, the carrying table curvature adjusting mechanism is operated to control the curvature of the carrying table to change one time in each minute within the predetermined period of time.

In Step 3 and Step 5, the array substrate is positioned on the carrying table such that a center point of the array substrate is coincident with a center point of the carrying table.

The present invention also provides a device for releasing film layer stress of an array substrate, which comprises: a flexible carrying table and a carrying table curvature adjusting mechanism coupled to the carrying table;

wherein the carrying table curvature adjusting mechanism is operable to control an upper surface of the carrying table to change between a first arc surface and a second arc surface; and the first arc surface is a concave curve is a concave curved surface that is recessed with respect to a horizontal plane and has a radius of curvature that is a predetermined first radius of curvature; and the second arc surface is a convex curved surface that is raised with respect to the horizontal plane and has a radius of curvature that is a predetermined second radius of curvature.

The first radius of curvature and the second radius of curvature are each between 4 m and 10 m; and the carrying table is made of a material comprising a rubber or resinous material.

The present invention further provides a method for releasing film layer stress of an array substrate, which comprises the following steps:

Step 1: providing a flexible carrying table and a carrying table curvature adjusting mechanism coupled to the carrying table;

Step 2: providing an array substrate, wherein the array substrate has a lengthwise edge having a length that is smaller than a length and a width of the carrying table;

Step 3: operating the carrying table curvature adjusting mechanism to cause the carrying table to curve so as to have an upper surface of the carrying table deformed into a first arc surface, and positioning the array substrate on the upper surface of the carrying table such that a first center line of the array substrate is coincident with a center line of the first arc surface, wherein the first arc surface is a concave curved surface that is recessed with respect to a horizontal plane and has a radius of curvature that is a predetermined first radius of curvature;

Step 4: keeping the array substrate still on the carrying table for a predetermined period of time and operating the carrying table curvature adjusting mechanism to gradually change the curvature of the curving of the carrying table within the predetermined period of time such that the upper surface of the carrying table varies from the first arc surface to a second arc surface, wherein the second arc surface is a convex curved surface that is raised with respect to the horizontal plane and has a radius of curvature that is a predetermined second radius of curvature;

Step 5: removing the array substrate, operating the carrying table curvature adjusting mechanism to restore the upper surface of the carrying table back to the first arc surface, rotating the array substrate about the center point thereof by 90 degrees and re-positioning on the upper surface of the carrying table such that a second center line of the array substrate is coincident with the center line of the first arc surface, the second center line being perpendicular to the first center line; and Step 6: keeping the array substrate still on the carrying table for a predetermined period of time and operating the carrying table curvature adjusting mechanism to gradually change the curvature of the carrying table within the predetermined period of time such that the upper surface of the carrying table varies from the first arc surface to the second arc surface to complete releasing of film layer stress of the array substrate;

wherein the first radius of curvature ranges from 4 m to 10 m; and wherein the second radius of curvature ranges from 4 m to 10 m.

The efficacy of the present invention is that the present invention provides a method for releasing film layer stress of an array substrate. In the method, the array substrate is positioned, in a still condition, on a carrying table involving an arc surface and a carrying table curvature adjusting mechanism is operated to gradually vary the curvature of the arc surface of the carrying table such that the array substrate, under the action of the gravity, is caused to curve according to the arc surface of the carrying table and the degree of curving varies following the variation of the curvature of the arc surface of the carrying table so as to make each film layer of the array substrate exhibiting uniform tension stress or compression stress, and eventually, the stress accumulated among the film layers of the array substrate during a manufacturing process can be released through the action of the external force, thereby reducing the influence that an external pressure causes on the property of a device provided on the array substrate during a subsequent process and uses thereof, so as to reduce poor displaying of a display panel and ensure product yield. The present invention also provides a device for releasing film layer stress of an array substrate, which effectively releases stress accumulated among film layers of the array substrate during a manufacturing process so as to reduce poor displaying of a display panel and ensure product yield.

BRIEF DESCRIPTION OF THE DRAWINGS

For better understanding of the features and technical contents of the present invention, reference will be made to the following detailed description of the present invention and the attached drawings. However, the drawings are provided only for reference and illustration and are not intended to limit the present invention.

In the drawings.

DETAILED DESCRIPTION OF THE PREFERRED EMBODIMENTS

To further expound the technical solution adopted in the present invention and the advantages thereof, a detailed description will be given with reference to the preferred embodiments of the present invention and the drawings thereof.

Figure 1:
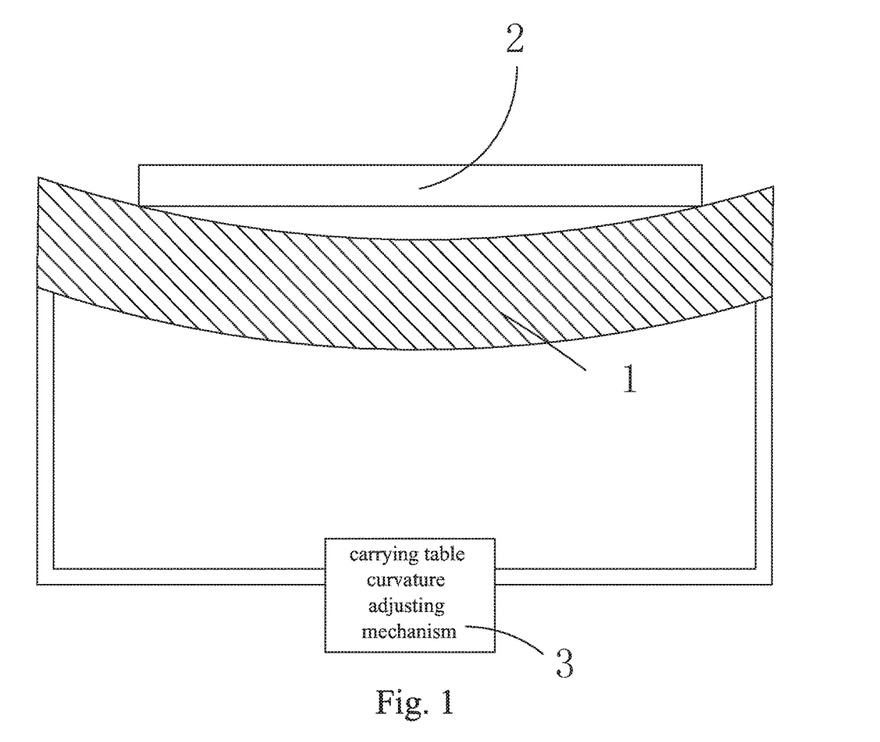
FIG. 1 is a cross-sectional view illustrating Step 1 to Step 3 of a method for releasing film layer stress of an array substrate according to the present invention.
Figure 7:
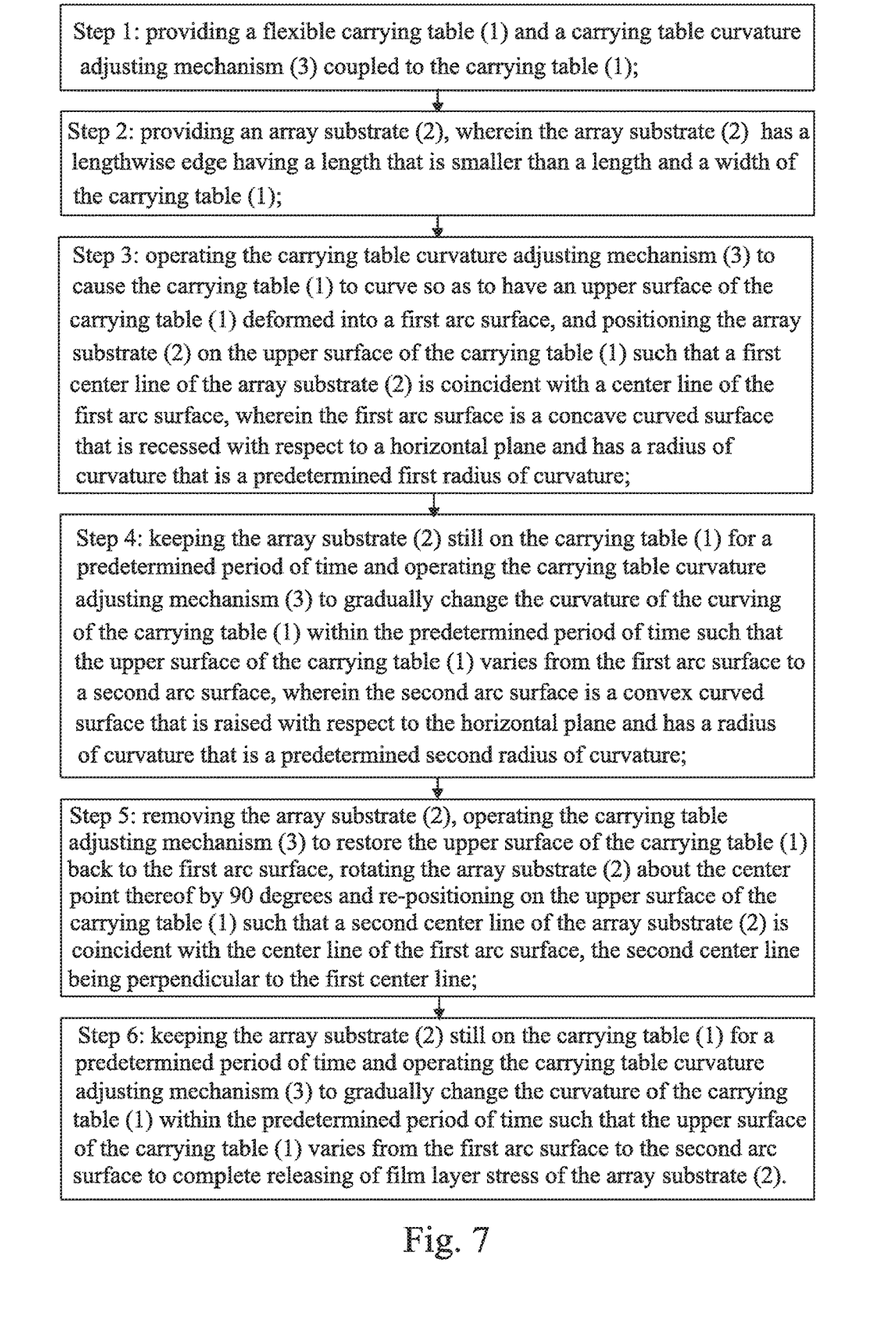
FIG. 7 is a flow chart illustrating the method for releasing film layer stress of an array substrate according to the present invention.

Referring to FIG. 7, the present invention provides a method for releasing film layer stress of an array substrate, which comprises the following steps:

Step 1: referring to FIG. 1, providing a flexible carrying table 1 and a carrying table curvature adjusting mechanism 3 coupled to the carrying table 1.

Specifically, the carrying table 1 is made of a material comprising a rubber or resinous material. The carrying table curvature adjusting mechanism 3 provides different pulling forces or pushing forces to the carrying table 1 so as to cause curving and deformation of a surface of the carrying table 1.

Figure 3:
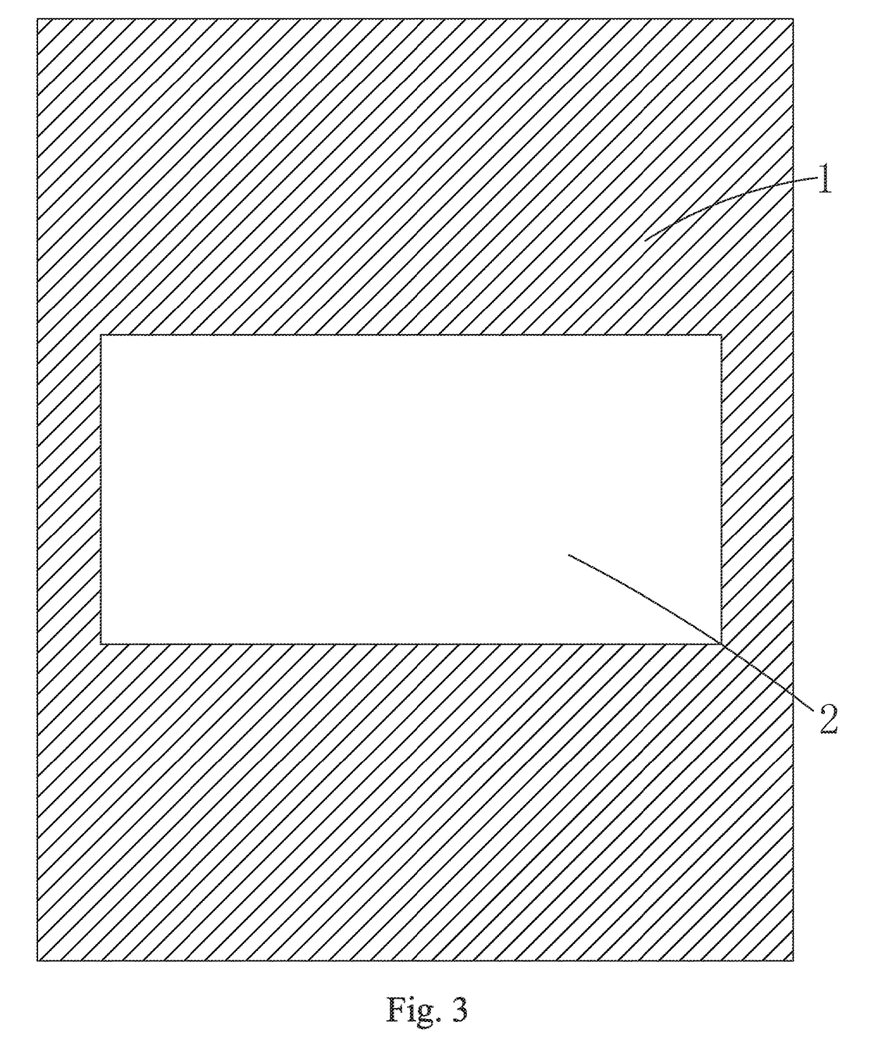
FIG. 3 is a top plan view illustrating Step 1 to Step 4 of the method for releasing film layer stress of an array substrate according to the present invention.

Step 2: referring to FIGS. 1 and 3, providing an array substrate 2, wherein the array substrate 2 has a lengthwise edge having a length that is smaller than a length and a width of the carrying table 1.

Specifically, the present invention is not limited to any specific film layer structure of the array substrate 2. Generally, the array substrate 2 comprises various film layers, including a backing plate, a thin-film transistor (TFT) layer arranged on the backing plate, a passivation layer arranged on the TFT layer, a planarization layer arranged on the passivation layer, and a pixel electrode arranged on the planarization layer. It is also possible for the array substrate 2 discussed herein to additionally include other film layers including for example a color resist layer, or to omit one or more of the above mentioned film layers, all being not affecting the application of the present invention.

Step 3: referring to FIGS. 1 and 3, operating the carrying table curvature adjusting mechanism 3 to cause the carrying table 1 to curve so as to have an upper surface of the carrying table 1 deformed into a first arc surface, and positioning the array substrate 2 on the upper surface of the carrying table 1 such that a first center line of the array substrate 2 is coincident with a center line of the first arc surface, wherein the first arc surface is a concave curved surface that is recessed with respect to a horizontal plane and has a radius of curvature that is a predetermined first radius of curvature.

Preferably, in Step 3, the array substrate 2 is positioned on the carrying table 1 such that a center point of the array substrate 2 is coincident with a center point of the carrying table 1.

Specifically, to ensure a desired effect of releasing stress, a preferred range of the first radius of curvature of the first arc surface is between 4 m and 10 m.

Figure 2:
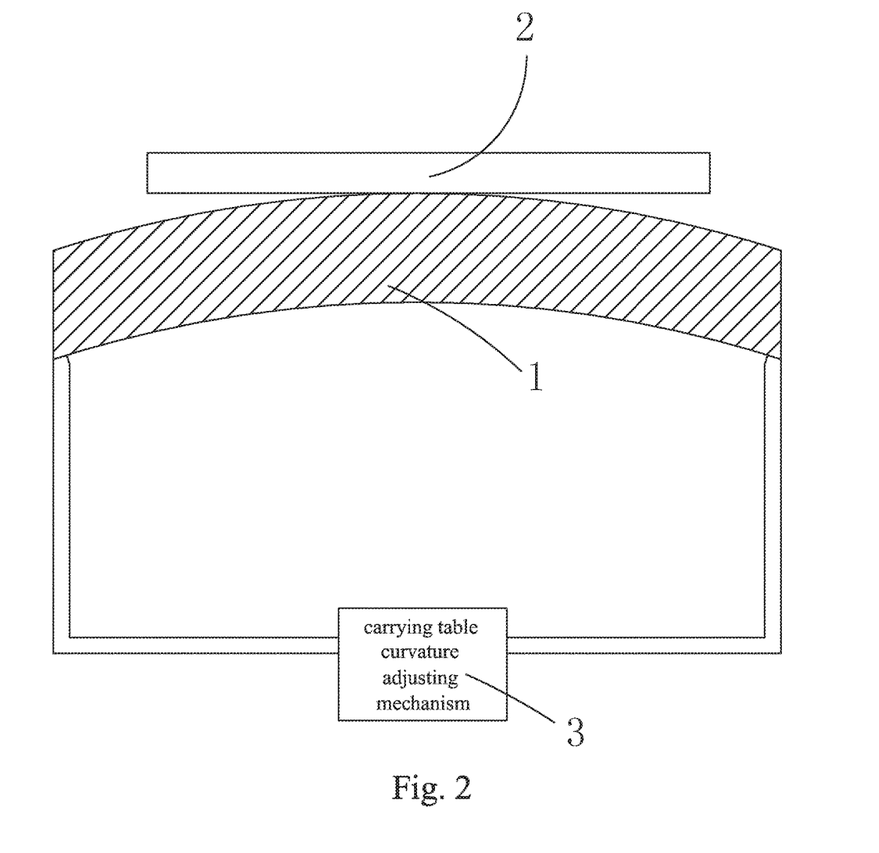
FIG. 2 is a cross-sectional view illustrating Step 4 of the method for releasing film layer stress of an array substrate according to the present invention.

Step 4: referring to FIGS. 1, 2, and 3, keeping the array substrate 2 still on the carrying table 1 for a predetermined period of time and operating the carrying table curvature adjusting mechanism 3 to gradually change the curvature of the curving of the carrying table 1 within the predetermined period of time such that the upper surface of the carrying table 1 varies from the first arc surface to a second arc surface, wherein the second arc surface is a convex curved surface that is raised with respect to the horizontal plane and has a radius of curvature that is a predetermined second radius of curvature.

Specifically, to ensure a desired effect of stress releasing and also to provide a desired efficiency of the process, the predetermined period of time is preferably within a range between 10 minutes and 30 minutes. The carrying table curvature adjusting mechanism 3 is operated to control the curvature of the carrying table 1 to change one time per minute within the predetermined period of time.

Specifically, to ensure a desired effect of stress releasing, a preferred range of the second radius of curvature of the second arc surface is between 4 m and 10 m.

Figure 4:
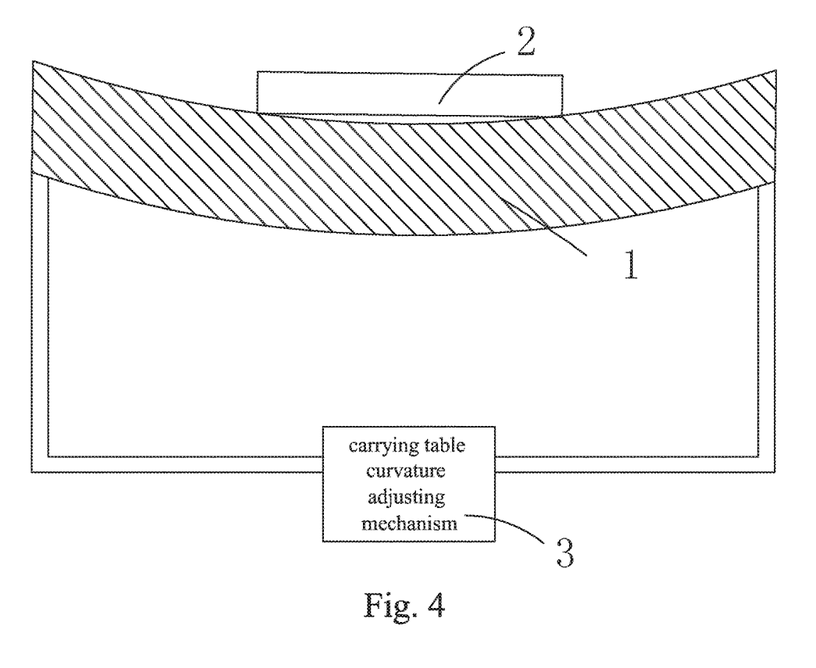
FIG. 4 is a cross-sectional view illustrating Step 5 of the method for releasing film layer stress of an array substrate according to the present invention.
Figure 6:
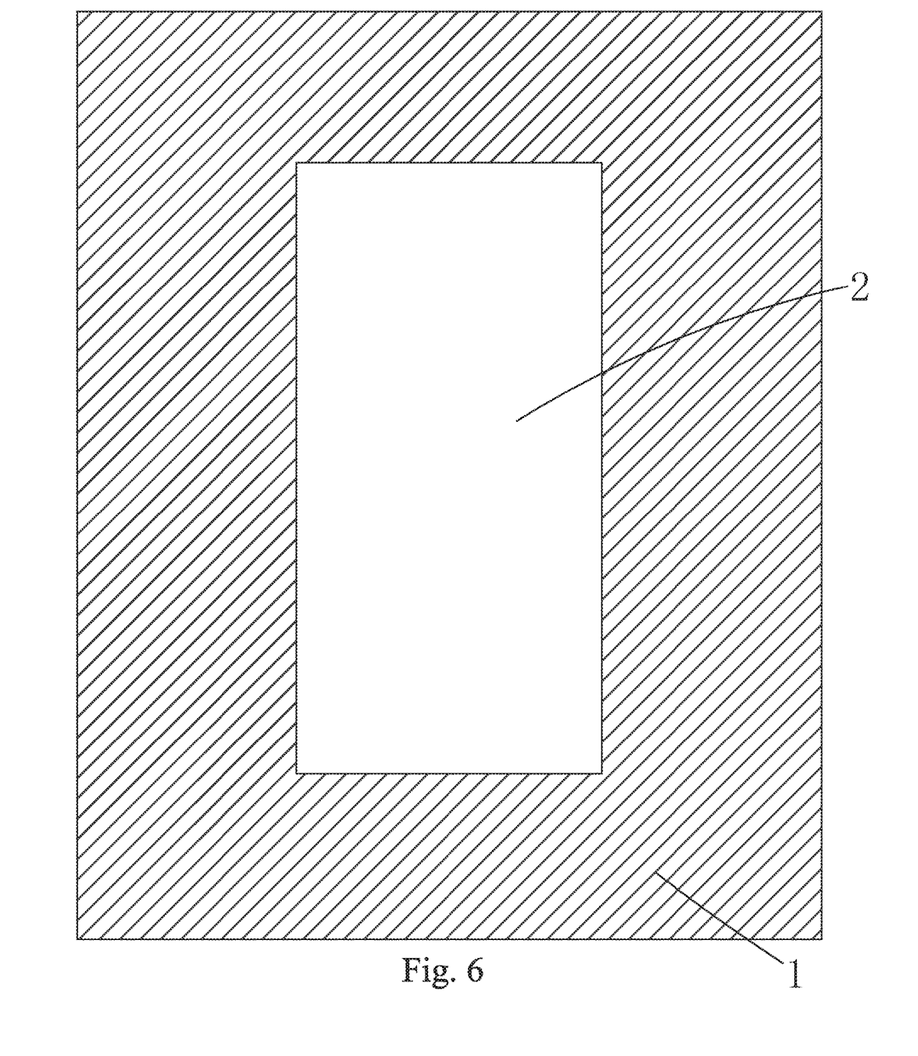
FIG. 6 is a top plan view illustrating Step 5 and Step 6 of the method for releasing film layer stress of an array substrate according to the present invention.

Step 5: referring to FIGS. 4 and 6, removing the array substrate 2, operating the carrying table curvature adjusting mechanism 3 to restore the upper surface of the carrying table 1 back to the first arc surface, rotating the array substrate 2 about the center point thereof by 90 degrees and re-positioning on the upper surface of the carrying table 1 such that a second center line of the array substrate 2 is coincident with the center line of the first arc surface, the second center line being perpendicular to the first center line.

Specifically, the second center line is a center line that is perpendicular to the lengthwise edge of the array substrate 2 and the first center line is a center line that is perpendicular to a widthwise edge of the array substrate 2, or alternatively, the first center line is a center line that is perpendicular to the lengthwise edge of the array substrate 2 and the second center line is a center line that is perpendicular to the widthwise edge of the array substrate 2.

Preferably, in Step 5, the array substrate 2 is positioned on the carrying table 1 such that the center point of the array substrate 2 is coincident with the center point of the carrying table 1.

Figure 5:
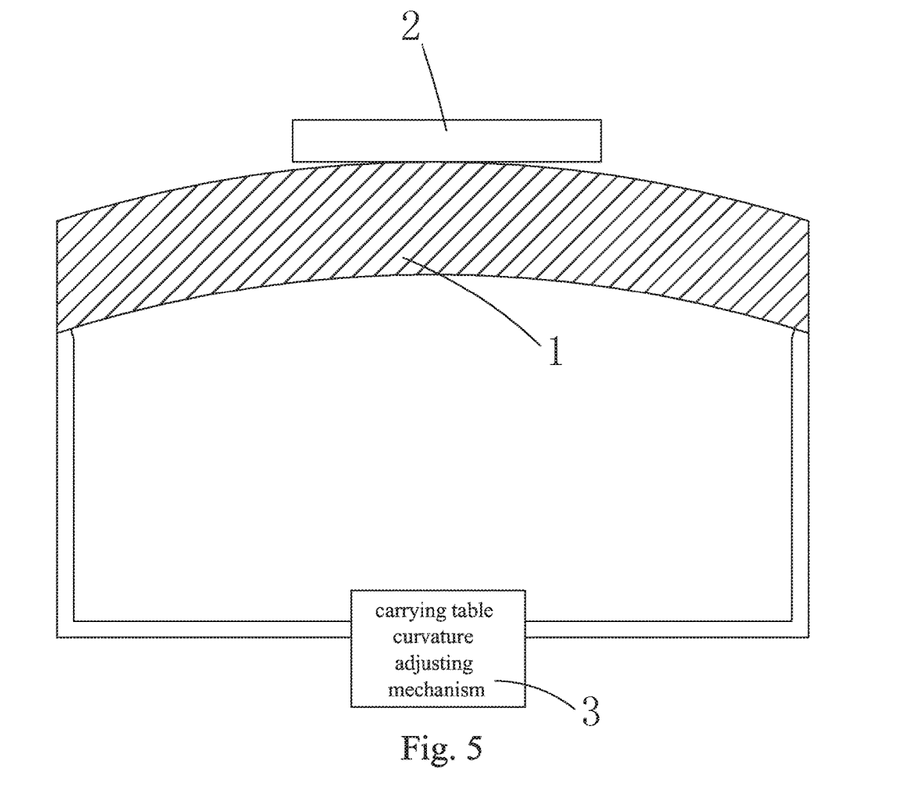
FIG. 5 is a cross-sectional view illustrating Step 6 of the method for releasing film layer stress of an array substrate according to the present invention.

Step 6: referring to FIGS. 5 and 6, keeping the array substrate 2 still on the carrying table 1 for a predetermined period of time and operating the carrying table curvature adjusting mechanism 3 to gradually change the curvature of the carrying table 1 within the predetermined period of time such that the upper surface of the carrying table 1 varies from the first arc surface to the second arc surface to complete releasing of film layer stress of the array substrate 2.

Specifically, the predetermined period of time involved in Step 6 is identical to the predetermined period of time of Step 4 and preferably, the predetermined period of time is within a range between 10 minutes and 30 minutes. The carrying table curvature adjusting mechanism 3 is operated to control the curvature of the carrying table 1 to change one time per minute within the predetermined period of time.

Specifically, in Step 4 and Step 6, the array substrate 2 is positioned, in a still condition, on the carrying table 1 involving an arc surface and the carrying table curvature adjusting mechanism 3 is operated to gradually vary the curvature of the arc surface of the carrying table 1 such that the array substrate 2, under the action of the gravity, is caused to curve according to the arc surface of the carrying table 1 and the degree of curving varies following the variation of the curvature of the arc surface of the carrying table 1 so as to make each film layer of the array substrate 2 exhibiting uniform tension stress or compression stress, thereby effectively releasing stress accumulated among the film layers of the array substrate 2 during a manufacturing process.

Specifically, in Step 6, the array substrate 2 is rotated by 90 degrees so that each film layer of the array substrate 2 may exhibit uniform tension stress or compression stress in both long edge direction and short edge direction thereby ensuing a desired effect of releasing the stress accumulated among the film layers of the array substrate 2.

It is noted that the method for releasing film layer stress of an array substrate according to the present invention is provided for releasing film layer stress of an array substrate 2 after the array substrate 2 has completed the array engineering, but before the cell engineering.

Further, by releasing the stress accumulated among the film layers of the array substrate 2 during the manufacturing process, it is possible to reduce the influence that an external pressure causes on the property of a device provided on the array substrate 2 during a subsequent process (such as cell engineering) and uses thereof, so as to reduce poor displaying of a display panel and ensure product yield.

Figure 8:
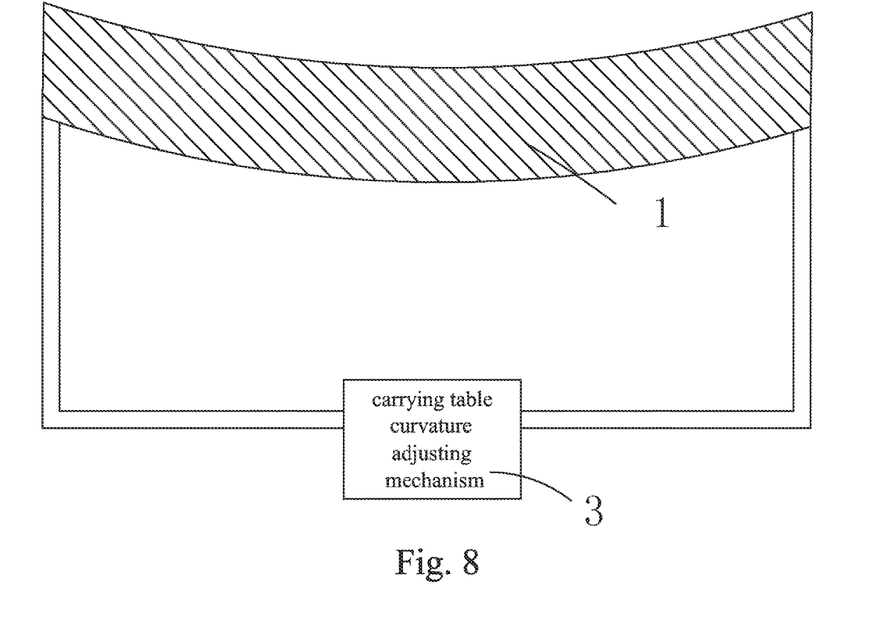
FIG. 8 is a schematic cross-sectional view illustrating a structure of a device for releasing film layer stress of an array substrate according to the present invention.

Referring to FIG. 8, the present invention also provides a device for releasing film layer stress of an array substrate that is provided for realizing the above-discussed method and comprises: a flexible carrying table 1 and a carrying table curvature adjusting mechanism 3 coupled to the carrying table 1.

The carrying table curvature adjusting mechanism 3 is operable to control an upper surface of the carrying table 1 to change between a first arc surface and a second arc surface.

The first arc surface is a concave curve is a concave curved surface that is recessed with respect to a horizontal plane and has a radius of curvature that is a predetermined first radius of curvature; and the second arc surface is a convex curved surface that is raised with respect to the horizontal plane and has a radius of curvature that is a predetermined second radius of curvature.

Specifically, the first radius of curvature and the second radius of curvature are each between 4 m and 10 m; and the carrying table 1 is made of a material comprising a rubber or resinous material.

In summary, the present invention provides a method for releasing film layer stress of an array substrate. In the method, the array substrate is positioned, in a still condition, on a carrying table involving an arc surface and a carrying table curvature adjusting mechanism is operated to gradually vary the curvature of the arc surface of the carrying table such that the array substrate, under the action of the gravity, is caused to curve according to the arc surface of the carrying table and the degree of curving varies following the variation of the curvature of the arc surface of the carrying table so as to make each film layer of the array substrate exhibiting uniform tension stress or compression stress, and eventually, the stress accumulated among the film layers of the array substrate during a manufacturing process can be released through the action of the external force, thereby reducing the influence that an external pressure causes on the property of a device provided on the array substrate during a subsequent process and uses thereof, so as to reduce poor displaying of a display panel and ensure product yield. The present invention also provides a device for releasing film layer stress of an array substrate, which effectively releases stress accumulated among film layers of the array substrate during a manufacturing process so as to reduce poor displaying of a display panel and ensure product yield.

Based on the description given above, those having ordinary skills in the art may easily contemplate various changes and modifications of he technical solution and the technical ideas of the present invention. All these changes and modifications are considered belonging to the protection scope of the present invention as defined in the appended claims.

What is claimed is:

1. A method for releasing film layer stress of an array substrate, comprising the following steps:
    Step 1: providing a flexible carrying table and a carrying table curvature adjusting mechanism coupled to the carrying table;
    Step 2: providing an array substrate, wherein the array substrate has a lengthwise edge having a length that is smaller than a length and a width of the carrying table;
    Step 3: operating the carrying table curvature adjusting mechanism to cause the carrying table to curve so as to have an upper surface of the carrying table deformed into a first arc surface, and positioning the array substrate on the upper surface of the carrying table such that a first center line of the array substrate is coincident with a center line of the first arc surface, wherein the first arc surface is a concave curved surface that is recessed with respect to a horizontal plane and has a radius of curvature that is a predetermined first radius of curvature;
    Step 4: keeping the array substrate still on the carrying table for a predetermined period of time and operating the carrying table curvature adjusting mechanism to gradually change the curvature of the curving of the carrying table within the predetermined period of time such that the upper surface of the carrying table varies from the first arc surface to a second arc surface, wherein the second arc surface is a convex curved surface that is raised with respect to the horizontal plane and has a radius of curvature that is a predetermined second radius of curvature;
    Step 5: removing the array substrate, operating the carrying table curvature adjusting mechanism to restore the upper surface of the carrying table back to the first arc surface, rotating the array substrate about the center point thereof by 90 degrees and re-positioning on the upper surface of the carrying table such that a second center line of the array substrate is coincident with the center line of the first arc surface, the second center line being perpendicular to the first center line; and
    Step 6: keeping the array substrate still on the carrying table for a predetermined period of time and operating the carrying table curvature adjusting mechanism to gradually change the curvature of the carrying table within the predetermined period of time such that the upper surface of the carrying table varies from the first arc surface to the second arc surface to complete releasing of film layer stress of the array substrate;
    wherein the first radius of curvature ranges from 4 m to 10 m.

2. The method for releasing film layer stress of an array substrate as claimed in claim 1, wherein the second radius of curvature ranges from 4 m to 10 m.

3. The method for releasing film layer stress of an array substrate as claimed in claim 1, wherein the predetermined period of time is between 10 minutes and 30 minutes.

4. The method for releasing film layer stress of an array substrate as claimed in claim 1, wherein film layer stress of the array substrate is released after the array substrate has completed array engineering but before cell engineering.

5. The method for releasing film layer stress of an array substrate as claimed in claim 1, wherein the carrying table is made of a material comprising a rubber or resinous material.

6. The method for releasing film layer stress of an array substrate as claimed in claim 1, wherein in Step 4 and Step 6, the carrying table curvature adjusting mechanism is operated to control the curvature of the carrying table to change one time in each minute within the predetermined period of time.

7. The method for releasing film layer stress of an array substrate as claimed in claim 1, wherein in Step 3 and Step 5, the array substrate is positioned on the carrying table such that a center point of the array substrate is coincident with a center point of the carrying table.

8. A method for releasing film layer stress of an array substrate, comprising the following steps:
   Step 1: providing a flexible carrying table and a carrying table curvature adjusting mechanism coupled to the carrying table;
   Step 2: providing an array substrate, wherein the array substrate has a lengthwise edge having a length that is smaller than a length and a width of the carrying table;
   Step 3: operating the carrying table curvature adjusting mechanism to cause the carrying table to curve so as to have an upper surface of the carrying table deformed into a first arc surface, and positioning the array substrate on the upper surface of the carrying table such that a first center line of the array substrate is coincident with a center line of the first arc surface, wherein the first arc surface is a concave curved surface that is recessed with respect to a horizontal plane and has a radius of curvature that is a predetermined first radius of curvature;
   Step 4: keeping the array substrate still on the carrying table for a predetermined period of time and operating the carrying table curvature adjusting mechanism to gradually change the curvature of the curving of the carrying table within the predetermined period of time such that the upper surface of the carrying table varies from the first arc surface to a second arc surface, wherein the second arc surface is a convex curved surface that is raised with respect to the horizontal plane and has a radius of curvature that is a predetermined second radius of curvature;
   Step 5: removing the array substrate, operating the carrying table curvature adjusting mechanism to restore the upper surface of the carrying table back to the first arc surface, rotating the array substrate about the center point thereof by 90 degrees and re-positioning on the upper surface of the carrying table such that a second center line of the array substrate is coincident with the center line of the first arc surface, the second center line being perpendicular to the first center line; and
   Step 6: keeping the array substrate still on the carrying table for a predetermined period of time and operating the carrying table curvature adjusting mechanism to gradually change the curvature of the carrying table within the predetermined period of time such that the upper surface of the carrying table varies from the first arc surface to the second arc surface to complete releasing of film layer stress of the array substrate;
   wherein the first radius of curvature ranges from 4 m to 10 m; and
   wherein the second radius of curvature ranges from 4 m to 10 m.

9. The method for releasing film layer stress of an array substrate as claimed in claim 8, wherein the predetermined period of time is between 10 minutes and 30 minutes.

10. The method for releasing film layer stress of an array substrate as claimed in claim 8, wherein film layer stress of the array substrate is released after the array substrate has completed array engineering but before cell engineering.

11. The method for releasing film layer stress of an array substrate as claimed in claim 8, wherein the carrying table is made of a material comprising a rubber or resinous material.

12. The method for releasing film layer stress of an array substrate as claimed in claim 8, wherein in Step 4 and Step 6, the carrying table curvature adjusting mechanism is operated to control the curvature of the carrying table to change one time in each minute within the predetermined period of time.

13. The method for releasing film layer stress of an array substrate as claimed in claim 8, wherein in Step 3 and Step 5, the array substrate is positioned on the carrying table such that a center point of the array substrate is coincident with a center point of the carrying table.

* * * * *